United States Patent [19]
Uematsu et al.

[11] Patent Number: 5,717,400
[45] Date of Patent: *Feb. 10, 1998

[54] HIGH-FREQUENCY SIGNAL GENERATOR AND RADAR MODULE

[75] Inventors: Hiroshi Uematsu; Hiroyuki Ando, both of Saitama; Tsutomu Yoneyama, Miyagi; Nobuyoshi Takeuchi; Shigeki Kato, both of Saitama, all of Japan

[73] Assignee: Honda Giken Kogyo Kabushiki Kaisha, Tokyo, Japan

[ * ] Notice: The term of this patent shall not extend beyond the expiration date of Pat. No. 5,394,154.

[21] Appl. No.: 400,185

[22] Filed: Feb. 24, 1995

Related U.S. Application Data

[63] Continuation of Ser. No. 120,024, Sep. 10, 1993, Pat. No. 5,394,154.

[30] Foreign Application Priority Data

| Sep. 11, 1992 | [JP] | Japan | 4-269629 |
| Dec. 1, 1992 | [JP] | Japan | 4-345409 |
| Dec. 1, 1992 | [JP] | Japan | 4-345410 |

[51] Int. Cl.$^6$ ............................................. H03B 7/14
[52] U.S. Cl. ............................ 342/165; 331/68; 331/96
[58] Field of Search ............................. 342/165; 331/68, 331/96

[56] References Cited

U.S. PATENT DOCUMENTS

| 2,595,078 | 4/1952 | Iams | 178/44 |
| 4,016,506 | 4/1977 | Kofol | 331/96 |
| 4,215,313 | 7/1980 | Chang et al. | 455/326 |
| 4,426,628 | 1/1984 | Malecki et al. | 331/96 |
| 4,463,330 | 7/1984 | Yoneyama | 333/239 |
| 4,511,865 | 4/1985 | Dixon, Jr. | 333/17 L |
| 4,581,591 | 4/1986 | Jacobs et al. | 331/96 |
| 4,731,611 | 3/1988 | Müller et al. | |
| 4,890,074 | 12/1989 | Ondria | |
| 4,922,211 | 5/1990 | Otremba et al. | 331/68 |
| 5,153,531 | 10/1992 | Fujisaki | 331/67 |
| 5,394,154 | 2/1995 | Uematsu et al. | 342/165 |

FOREIGN PATENT DOCUMENTS

| 0 129 251 | 6/1984 | Germany. |
| 75 7 9 6 8 | 10/1970 | Netherlands. |
| 1 293 986 | 10/1972 | United Kingdom. |
| 2 042 300 | 1/1980 | United Kingdom. |
| 2 148 065 | 5/1985 | United Kingdom. |

OTHER PUBLICATIONS

European Search Report for EP 93 30 7199 For 80.83.60311.
Article Entitled "Millimeter–Wave Transmitter and Receiver Using The Nonradiative Dielectric Waveguide", Yoneyama, 1989 IEEE.

Primary Examiner—Mark Hellner
Attorney, Agent, or Firm—Lyon & Lyon LLP

[57] ABSTRACT

A radar module includes a high-frequency signal generator comprising upper and lower parallel conductive plates, at least one dielectric rod held between the parallel conductive plates, a metal diode mount held between the parallel conductive plates, a gunn diode member mounted on a side of the diode mount, and a printed-circuit board mounted on the side of the diode mount in covering relationship to the gunn diode member and having a bias supply circuit on its surface for supplying a bias voltage to the gunn diode member. One terminal of the gunn diode member extends through a through hole defined in the printed-circuit board, is exposed in the vicinity of the surface of the diode mount, and is connected to the bias supply circuit. The printed-circuit board has a rectangular metal pattern dimensionally adjustable for adjusting the oscillation frequency of the gunn diode member, and a varactor diode for modulating the frequency of a signal generated by the gunn diode member so that the high-frequency signal generator can function as an FM signal generator.

2 Claims, 6 Drawing Sheets

HIGH-FREQUENCY SIGNAL GENERATOR AND RADAR MODULE

This is a continuation of application Ser. No. 08/120,024, filed on Sep. 10, 1993 and which designated the U.S., now U.S. Pat. No. 5,394,154.

BACKGROUND OF THE INVENTION

1. Field of the Invention:

The present invention relates to a high-frequency signal generator for use in a millimeter wave radar device installed on a motor vehicle, and a radar module employing such a high-frequency signal generator.

2. Description of the Prior Art:

Radar devices for use on motor vehicles such as automobiles in combination with warning units for preventing collisions are required to have a high degree of resolution for detecting objects in close distances of about several tens of centimeters. In view of such a high-resolution requirement, an FM radar is preferable to a pulse radar for use in the vehicle-mounted radar devices. Since the maximum range that may be detected up to a target such as a preceding motor vehicle or an upcoming motor vehicle is of a relatively short distance of about several hundred meters, it is suitable for such a radar to use radiowaves in the millimeter range which have a frequency of about 60 GHz and can be attenuated greatly upon propagation in order to prevent radiated radiowaves from being propagated beyond a necessary range and also from interfering with existing microwave communications equipment. Use of millimeter waves is also preferable from the viewpoint of reducing the size of a radar module including an antenna, FM signal generators in front and rear stages, a mixer, and other components.

Heretofore, FM radar modules in the millimeter range are constructed in the form of a microstrip line or a wadeguide. Because the microstrip line radiates a large amount of power, it suffers a large loss and tends to cause interference between a plurality of modules, resulting in a reduction in measuring accuracy. The waveguide is disadvantageous in that its circuit is large in size and expensive.

One of the attempts to solve the above problems is a non-radiative dielectric (NRD) waveguide as disclosed in an article "Millimeter wave integrated circuit using a non-radiative dielectric waveguide" written by Yoneyama et al. and published in the Journal of Electronic Information Communications Society, vol. J 73 C - 1 No. 3 pp. 87–94, March 1990. The disclosed non-radiative dielectric waveguide comprises two confronting conductive plates spaced from each other by a distance slightly smaller than a half wavelength and a rod-shaped dielectric member inserted between the conductive plates for allowing only propagations along the rod-shaped dielectric member. The upper and lower surfaces of the non-radiative dielectric waveguide are completely shielded by the conductive plates. Since the distance between the conductive plates is shorter than the half wavelength, radiowaves are fully prevented from leaking laterally out of the non-radiative dielectric waveguide. Therefore, any power radiation from the non-radiative dielectric waveguide is very small, effectively avoiding radiation loss in a module and interference between modules.

Various components including a directional coupler and an isolator can easily be fabricated by positioning non-radiative dielectric waveguides closely to each other or adding ferrite. Therefore, modules employing non-radiative dielectric waveguides can be made smaller than the conventional microstrip arrangement where components are separately produced and interconnected by a waveguide. The above article also discloses small-size, high-performance transmitter and receiver structures for use in the millimeter wave band which employ non-radiative dielectric waveguides.

Figure 10:
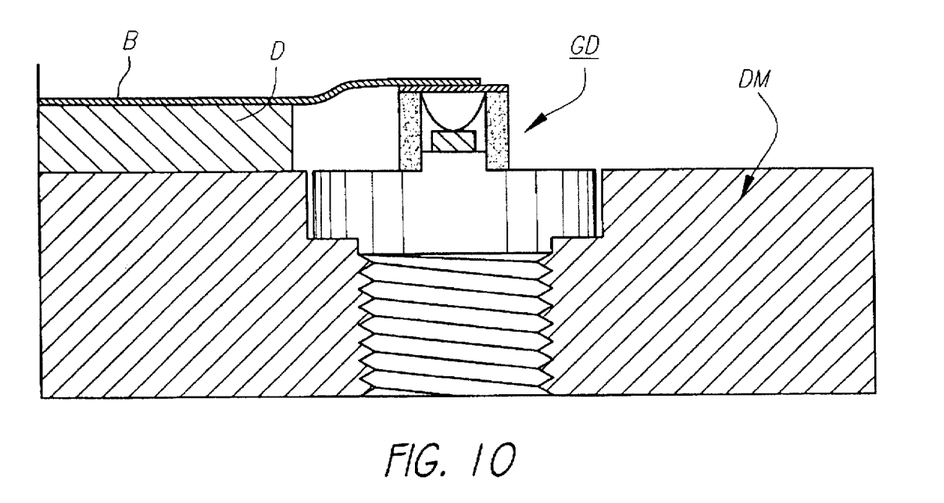
FIG. 10 is a fragmentary cross-sectional view of a conventional diode mount with a gunn diode mounted thereon.

FIG. 10 of the accompanying drawings shows in cross section the structure of a conventional gunn oscillator for use as a high-frequency signal generator in a transmitter in the millimeter wave band. The conventional gunn oscillator comprises a gunn diode GD threaded in a diode mount DM. The distal end of a bias supply line B is fixedly bonded by silver paste to an upper conductor of the gunn diode GD which is exposed from a dielectric substrate D by cutting off a portion of the dielectric substrate D with a knife.

The high-frequency signal generator with the gunn oscillator shown in FIG. 10 cannot be fabricated with good reproducibility because the process of cutting off the dielectric substrate D with a knife and bonding the end of the bias supply line B to the conductor is relatively complex and time-consuming.

The frequency adjustment for the high-frequency signal generator disclosed in the above article is cumbersome as the oscillation frequency is adjusted by adjusting the dimensions of a metal foil oscillator.

While the above article shows the high-frequency signal generator using the gunn diode, it does not discuss any optimum arrangement for an FM signal generator for use in an FM radar module.

Figure 11:
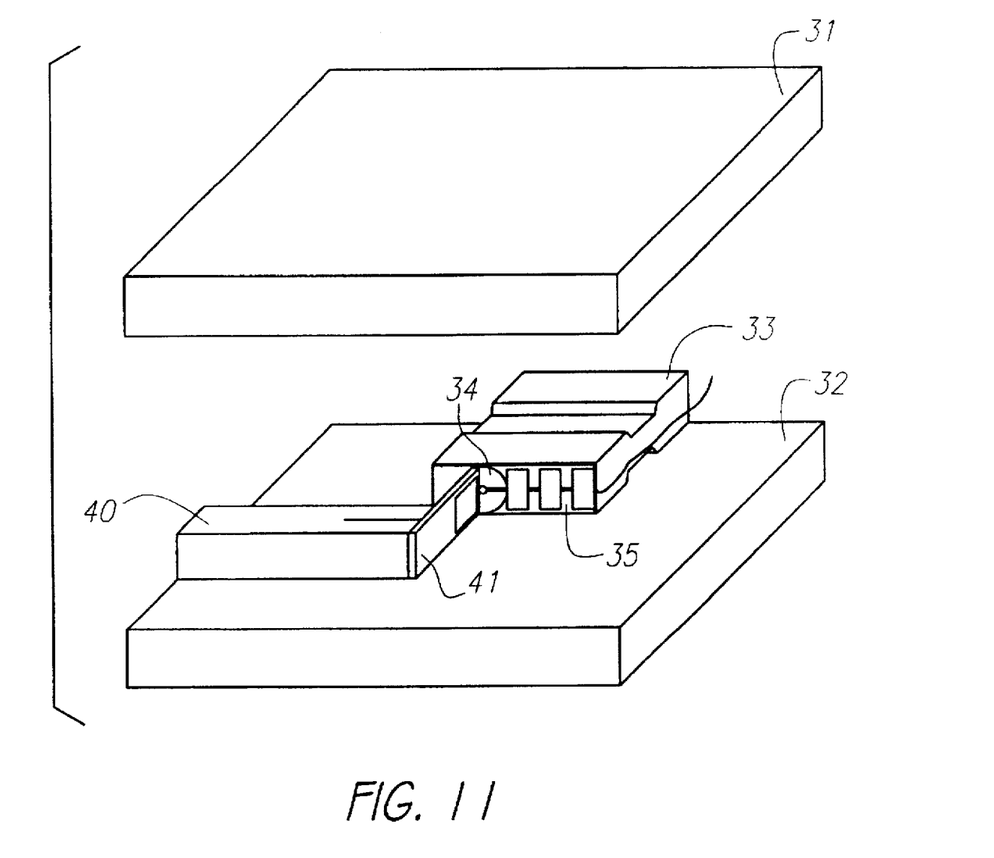
FIG. 11 is a perspective view of a conventional gunn oscillator and a non-radiative dielectric waveguide for guiding signals generated in the millimeter wave band by the gunn oscillator to an antenna.

The article also discloses a gunn oscillator as shown in FIG. 11 of the accompanying drawings and a non-radiative dielectric waveguide for guiding signals which are generated in the millimeter wave band by the gunn oscillator to an antenna or the like. As shown in FIG. 11, the gunn oscillator and its surrounding circuits comprise upper and lower conductive plates 31, 32 serving as a non-radiative dielectric waveguide, a diode mount 33 sandwiched between the upper and lower conductive plates 31, 32, a gunn diode 34 threaded in the diode mount 33, a printed-circuit board 35 fixed to a side of the diode mount 33, a dielectric rod 40 for guiding a signal generated in the millimeter wave band by the gunn diode 34 to an antenna or the like (not shown), and a metal foil oscillator 41 for guiding the signal generated in the millimeter wave band by the gunn diode 34 to the dielectric rod 40.

Figure 12A:
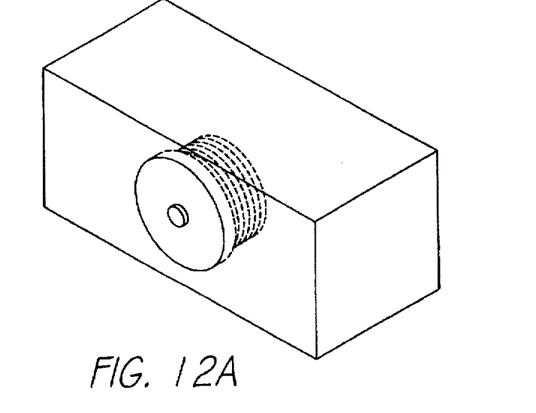
FIG. 12(A) is a perspective view of a conventional diode mount and a gunn diode mounted thereon.
Figure 12B:
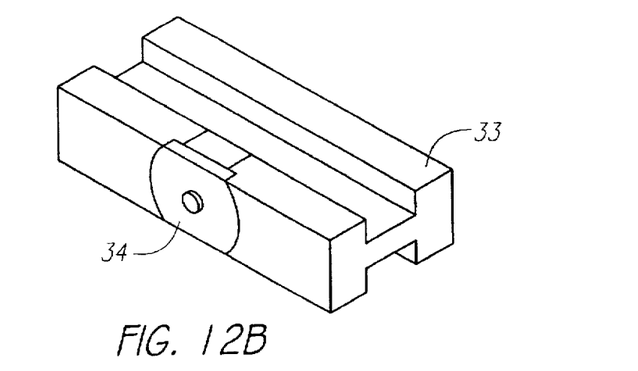
FIG. 12(B) is a perspective view of the diode mount and the gunn diode shown in FIG. 12(A) which have been cut off.

In FIG. 11, the distance between the upper and lower conductive plates 31, 32 is set to a value slightly smaller than half the wavelength of the signals used in the millimeter wave band. If the signals have a frequency of about 60 GHz, for example, then the distance between the upper and lower conductive plates 31, 32, and hence the thickness of the diode mount 33 is of a small value of about 2.5 mm. Commercially available packaged gunn diodes are mounted on a heat-radiating stud which is of a diameter ranging from 3 to 4 mm. Therefore, it is necessary to machine them to make them ready for use in actual applications, as shown in FIGS. 12(A) and 12(B). First, as shown in FIG. 12(A), a gunn diode 35 is threaded in a metal block which is 5 to 6 mm thick. Then, as shown in FIG. 12(B), upper and lower portions of the metal block are cut off to reduce the thickness thereof to about 2.5 mm, and grooves dimensioned to a ¼ wavelength are defined in the metal block to prevent the signals from leaking out. In this manner, the gunn diode 34 is mounted on the diode mount 33.

Inasmuch as the gunn oscillator requires complex machining as shown in FIGS. 12(A) and 12(B) to fabricate the diode mount 33 that is of a small thickness, the process of manufacturing the gunn oscillator is time-consuming, and the produced gunn oscillator is costly.

Figure 13:
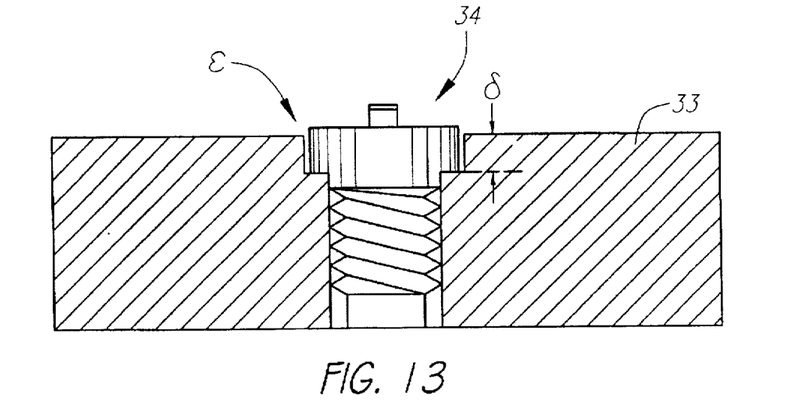
FIG. 13 is a fragmentary cross-sectional view of the conventional diode mount with the gunn diode mounted thereon.

Furthermore, as shown in FIG. 13 of the accompanying drawings, the diode mount 33 has a recessed step on which an upper flange of the gunn diode 34 is placed. Since the depth $\delta$ of the recessed step is subject to variations, the height $\epsilon$ that a lower conductor of the gunn diode 34 projects from the surface of the diode mount 33 also suffers variations, resulting in varying oscillation characteristics.

SUMMARY OF THE INVENTION

It is therefore an object of the present invention to provide a high-frequency signal generator which can easily be manufactured with good reproducibility, and a radar module employing such a high-frequency signal generator.

Another object of the present invention is to provide a high-frequency signal generator which allows an oscillation frequency to be adjusted with ease.

Still another object of the present invention is to provide a high-frequency signal generator which can easily be modified into an FM signal generator with easy and reliable FM signal frequency control, and a small-size FM radar module in the form of a non-radiative dielectric waveguide employing such an FM signal generator.

Yet another object of the present invention is to provide a high-frequency signal generator such as an FM signal generator which can be manufactured in a relatively short period of time and at a relatively low cost without the need for a complex machining process for reducing the thickness of a diode mount.

According to the present invention, a radar module includes a high-frequency signal generator comprising upper and lower parallel conductive plates, at least one dielectric rod held between the parallel conductive plates, a metal diode mount held between the parallel conductive plates, a gunn diode member mounted on a side of the diode mount, and a printed-circuit board mounted on the side of the diode mount in covering relationship to the gunn diode member and having a bias supply circuit on a surface thereof for supplying a bias voltage to the gunn diode member. One terminal of the gunn diode member extends through a through hole defined in the printed-circuit board, is exposed in the vicinity of the surface of the diode mount, and is connected to the bias supply circuit. The printed-circuit board has a rectangular metal pattern dimensionally adjustable for adjusting the oscillation frequency of the gunn diode member, and a varactor diode for modulating the frequency of a signal generated by the gunn diode member so that the high-frequency signal generator can function as an FM signal generator.

The high-frequency signal generator may further comprise a lower conductor mounted on the side of the mount and serving as a terminal of the oscillating element with the oscillating element disposed upside down with an operating layer thereof facing downwardly, a package mounted on the lower conductor in surrounding relationship to the oscillating element, and an upper conductor disposed on top of the package and serving as another terminal of the oscillating element.

The lower conductor may have a threaded member threaded in a threaded hole defined in the side of the mount. Alternatively, the lower conductor may comprise a disk-shaped pad integrally formed with the side of the mount.

The printed-circuit board may have a rectangular metal pattern dimensionally adjustable for adjusting the oscillation frequency of the oscillating element.

The printed-circuit board may have a varactor diode for modulating the frequency of a signal generated by the oscillating element, whereby the high-frequency signal generator can function as an FM signal generator.

The high-frequency signal generator may further comprise a metal foil resonator mounted on the conductive plate and interposed between the dielectric rod and the oscillating element for propagating a high-frequency signal generated by the oscillating element to the dielectric rod.

The above and further objects, details and advantages of the present invention will become apparent from the following detailed description of preferred embodiments thereof, when read in conjunction with the accompanying drawings.

DETAILED DESCRIPTION OF THE PREFERRED EMBODIMENTS

Figure 1:
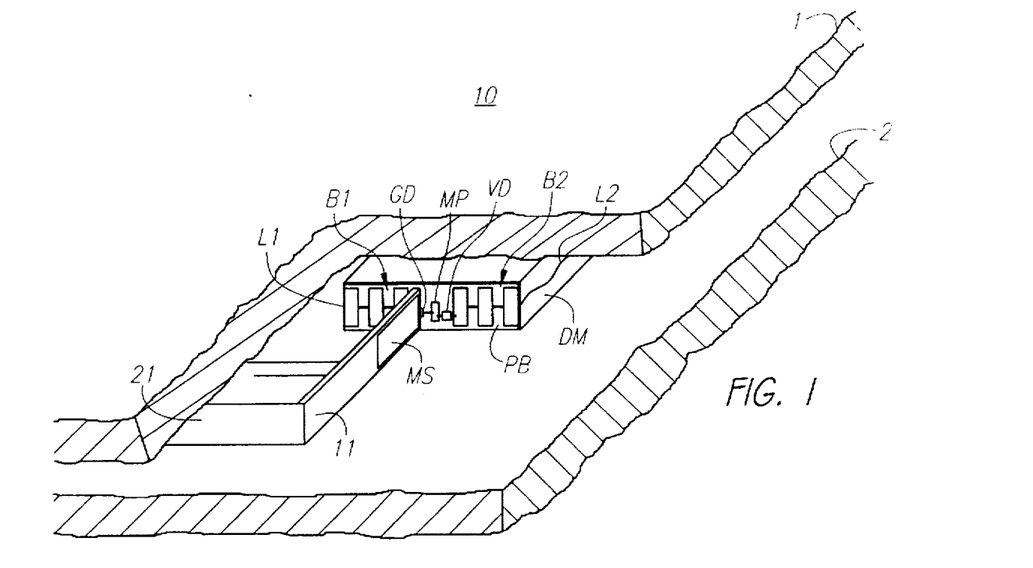
FIG. 1 is a perspective view, partly cut away, of a high-frequency signal generator and its associated components in a radar module according to a preferred embodiment of the present invention.

As shown in FIG. 1, a radar module according to a preferred embodiment of the present invention includes a high-frequency signal generator 10 and its associated components, the radar module being used as an FM radar module in the millimeter wave band for use on a motor vehicle such as an automobile.

As shown in FIG. 1, upper and lower parallel conductive plates 1, 2 serving as a non-radiative dielectric waveguide hold therebetween a dielectric rod 21 that constitutes part of the non-radiative dielectric waveguide, a diode mount DM of metal kept at a ground potential, a gunn diode member or gunn diode GD mounted on a side of the diode mount DM, a printed-circuit board PB fixed to the same side of the diode mount DM and having a bias supply circuit for supplying a bias voltage to the gunn diode GD, and an resonator 11 interposed between the printed-circuit board PB and the dielectric rod 21.

Figure 2:
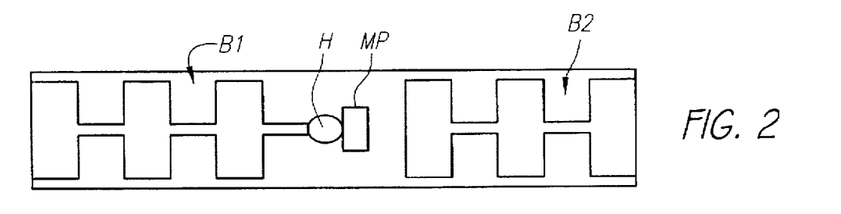
FIG. 2 is a plan view of a printed-circuit board for use in the high-frequency signal generator.

As shown in FIG. 2, the printed-circuit board PB has a central through hole H defined therein and first and second bias supply microstrip lines B1, B2 disposed on a surface of the printed-circuit board PB one on each side of the central through hole H, the first and second bias supply microstrip lines B1, B2 serving as the bias supply circuit. A rectangular metal pattern MP (described later on) is disposed between the first and second bias supply microstrip lines B1, B2, specifically between the through hole M and the second bias supply microstrip line B2. As shown in FIG. 1, leads L1, L2 are connected respectively to the first and second bias supply microstrip lines B1, B2.

Figure 5:
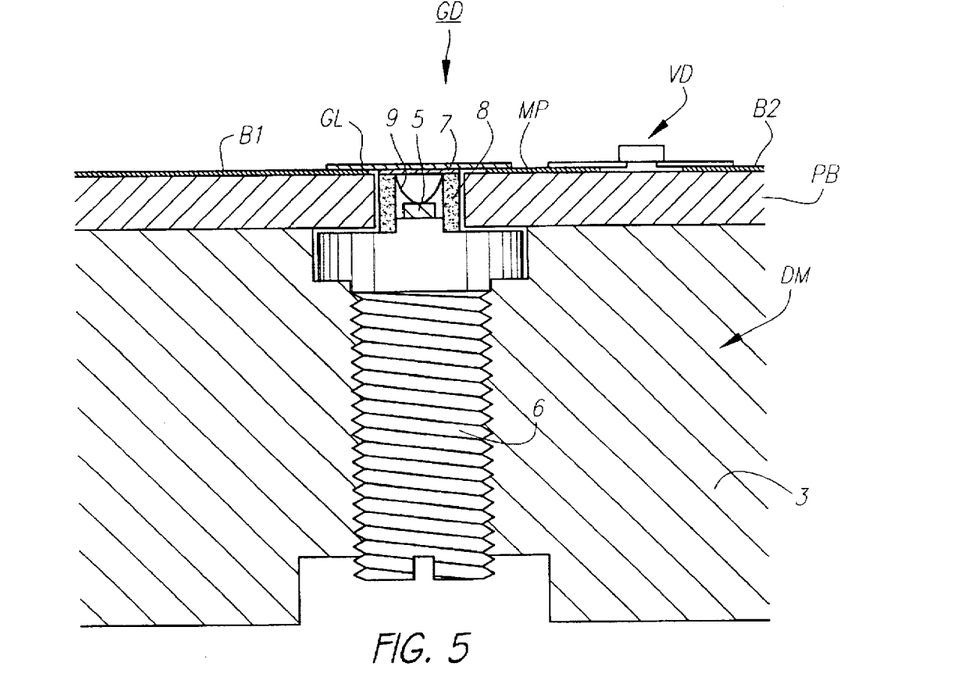
FIG. 5 is a fragmentary cross-sectional view of a diode mount with the gunn diode and the printed-circuit board of the high-frequency signal generator being mounted on a side thereof.

As shown in FIG. 5, the diode mount DM has an internally threaded hole 4 defined in a body 3 thereof and opening at a side thereof. The gunn diode GD has an externally threaded lower conductor 6 which is threaded in the hole 4. Therefore, the gunn diode GD is fixed to the central region of the side of the diode mount DM. The lower conductor 6 is substantially fully embedded in the hole 4 in the diode mount DM.

A package 8 is held on the distal end of the lower conductor 6 of the gunn diode GD, and a gunn diode element 5 as an oscillating element is disposed upside down in the package 8 with an operating layer facing downwardly. The gunn diode element 5 has a heat-generating terminal connected through the externally threaded lower conductor 6, which serves as a terminal member, to the body 3 of the diode mount DM, and kept at the ground potential that is supplied to the diode mount DM. Therefore, the lower conductor 6 functions as a heat radiating stud for the gunn diode member or gunn diode GD.

The gunn diode GD has an upper conductor 7 disposed on the top of the package 8 which houses the gunn diode element 5. The other terminal of the gunn diode element 5 is connected to the upper conductor 7 by a gold ribbon 9. The upper conductor 7 and the gold ribbon 9 serve as the other terminal member of the gunn diode GD.

As shown in FIG. 5, the upper conductor 7 on the top of the package 8 is inserted through the hole H that is defined centrally in the printed-circuit board PB which is fixed to the side of the diode mount DM in covering relationship to the gunn diode GD. The upper conductor 7 is disposed either to lie flush with the surface of the printed-circuit board PB on which the bias supply circuit is formed or to be exposed in the vicinity of the surface of the printed-circuit board PB. The upper conductor 7 is electrically connected by thermal compression to a gold ribbon or metal foil GL that extends between and is joined by thermal compression to an end of the first bias supply line B1 and the metal pattern MP on the printed-circuit board PB.

Figure 3:
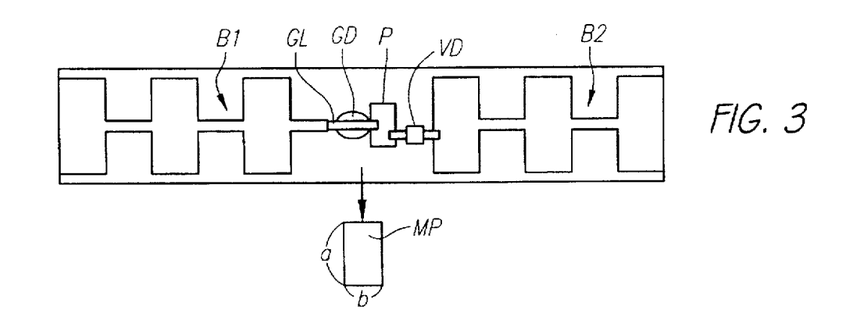
FIG. 3 is a plan view of the printed-circuit board with a gunn diode and a varactor diode mounted thereon.

According to this embodiment, a frequency-modulating varactor diode VD of the beam lead type extends between and is joined by thermal compression to the metal pattern MP and the second bias supply line B2 on the printed-circuit board PB, as shown in FIGS. 3 and 5. Therefore, the bias voltage on the gunn diode GD is adjusted by a bias voltage applied to the first bias supply line B1, and the bias voltage on the varactor diode VD is adjusted by the difference between bias voltages applied to the first and second bias supply lines B1, B2. The high-frequency signal generator 10 which is composed of the gunn diode GD and other components can function as an FM signal generator when the varactor diode VD is mounted as a variable reactance device.

Each of the first and second bias supply lines B1, B2 serves as a five-stage low-pass filter with its larger and smaller line width variations repeated at a constant period which is set to ¼ of the wavelength of FM signals that are to be generated in the millimeter wave band by the high-frequency signal generator. In this embodiment, the FM signals have a frequency of about 60 GHz, and hence the larger and smaller line width variations of the low-pass filter are repeated at the period of about 1.25 mm. The distance between the conductive plates 1, 2 of the non-radiative dielectric waveguide or the height of the side of the diode mount DM is set to a value of 2.5 mm or lower which is slightly smaller than half the wavelength of the FM signals.

Figure 4:
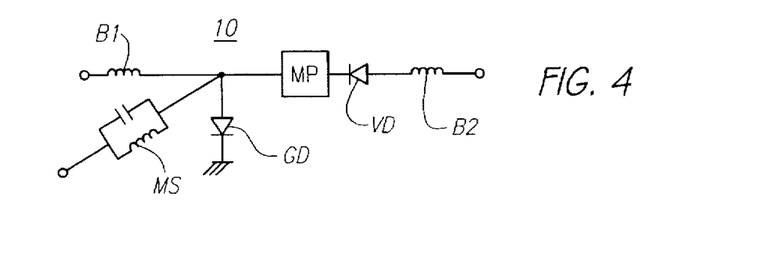
FIG. 4 is a circuit diagram of an equivalent circuit of the high-frequency signal generator and its associated components shown in FIG. 1.

FIG. 4 shows an equivalent circuit of the high-frequency signal generator 10, i.e., the FM signal generator 10 and its associated components, shown in FIG. 1. The metal foil resonator 11 which comprises a rectangular metal foil MS on the thin dielectric substrate 12 is interposed between the FM signal generator 10 or the gunn diode GD and the dielectric rod 21. The FM signals can be adjusted by adjusting the dimensions of the metal foil MS. The FM signals can also be adjusted by the dimensions of the rectangular metal pattern MP on the printed-circuit board PB. The metal foil MS may be replaced with a metal rod.

It has been confirmed that the oscillation frequency of the FM signal generator 10 can be roughly adjusted by dimensions a, b, shown in FIG. 3, of the rectangular metal pattern MP, and can be finely adjusted by the metal foil resonator 11 as shown in FIG. 1. Examples of the rough adjustment will be described below.

When the dimension b of the metal pattern MP was fixed to 0.3 mm and the other dimension a was varied, the oscillation frequency was varied as shown in Table 1 below before and after the metal foil resonator 11 was added to the non-radiative dielectric waveguide shown in FIG. 1 for propagation therethrough.

TABLE 1

| Dimension a | Before added | After added |
| --- | --- | --- |
| 1.2 mm | 51.4 GHz | — |
| 0.8 mm | 55.6 GHz | 59.5 GHz |
| 0.6 mm | 57.4 GHz | 61.0 GHz |

When the dimension a of the metal pattern MP was fixed to 0.8 mm and the other dimension b was varied, the oscillation frequency was varied as shown in Table 2 below before and after the metal foil resonator 11 was added to the non-radiative dielectric waveguide shown in FIG. 1 for propagation therethrough.

TABLE 2

| Dimension a | Before added | After added |
| --- | --- | --- |
| 0.4 mm | 53.2 GHz | 57.5 GHz |
| 0.3 mm | 55.6 GHz | 59.5 GHz |
| 0.2 mm | 57.7 GHz | 61.8 GHz |

Figure 6:
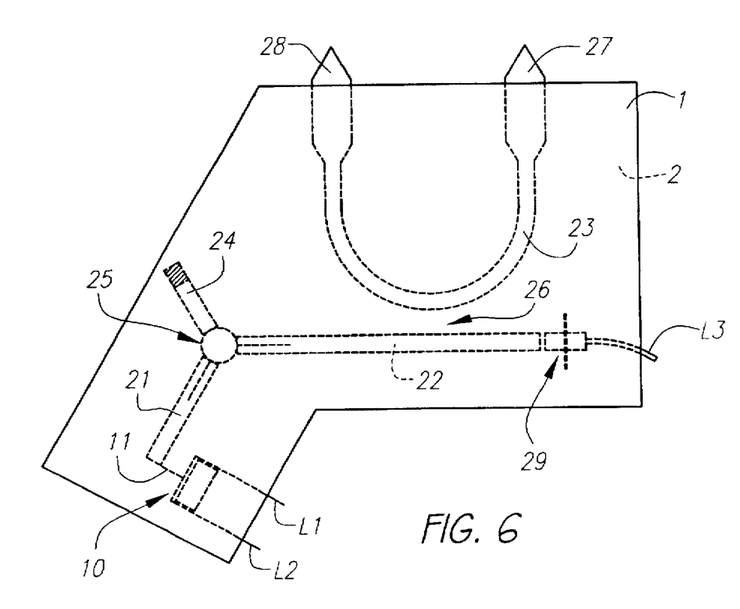
FIG. 6 is a schematic plan view of the radar module which incorporates the high-frequency signal generator.

FIG. 6 shows the radar module incorporating the high-frequency signal generator 10 as an FM signal generator.

The radar module functions as an FM radar module as the high-frequency signal generator 10 functions as an FM signal generator. The FM radar module has the FM signal generator 10, the metal foil resonator 11, a propagating means composed of various dielectric rods and other parts, and an antenna means.

The propagating means comprises the dielectric rod 21 as a first dielectric rod held between the upper and lower parallel conductive plates 1, 2, an isolator 25, a linear second dielectric rod 22 coupled to the first dielectric rod 21 through the isolator 25, a semicircular third dielectric rod 23 coupled to the second dielectric rod 22 through a directional coupler 26, and a fourth dielectric rod 24 coupled to the second dielectric rod 22 through the isolator 25. A single-diode mixer 29 is joined to the distal end of the second dielectric rod 22. The third dielectric rod 23 has a transmitting antenna 27 and a receiving antenna 28 respectively on its opposite ends. A resistive terminator is coupled to the distal end of the fourth dielectric rod 24.

In operation, an FM signal generated by the FM signal generator 10 is propagated through the first dielectric rod 21 and supplied to an input terminal of the isolator 25. The FM signal is then outputted from an output terminal of the isolator 25 to the linear second dielectric rod 22. The linear second dielectric rod 22 and the semicircular third dielectric rod 23, which has its convex portion disposed near the central region of the linear second dielectric rod 22, jointly form the directional coupler 26. Therefore, a portion of the FM signal outputted from the isolator 25 is transferred to the third dielectric rod 23, and radiated out from the transmitting antenna 27 on one of the ends of the third dielectric rod 23. The remainder of the FM signal outputted from the isolator 25 is propagated through the linear second dielectric rod 22 to its distal end where it is supplied as a local signal to the single-diode mixer 29.

A reflected wave (reflected signal) from an object is received by the receiving antenna 28. A portion of the received signal is transferred through the directional coupler 26 to the linear second dielectric rod 22, from which it is supplied to the single-diode mixer 29. The remainder of the received signal is radiated again from the transmitting antenna 27. The single-diode mixer 29 is supplied with the local signal from the output terminal of the isolator 25 through the second dielectric rod 22 and also with the reflected wave from the receiving antenna 28 through the directional coupler 26. The single-diode mixer 29 mixes the supplied signals and generates a beat signal, which is outputted to a coaxial line L3 extending from between the upper and lower conductive plates 1, 2.

The transmitting antenna 27 also receives the reflected wave from the object. The received signal is propagated through the semicircular third dielectric rod 23 to the receiving antenna 28, which radiates the signal again. A portion of the reflected wave received by the transmitting antenna 27 and a portion of the reflected signal which is reflected toward the FM signal generator 10 by the single-diode mixer 29 are supplied through the directional coupler 26 and the second dielectric rod 22 to the isolator 25, and then absorbed by the resistive terminator joined to the fourth dielectric rod 24.

Since the transmitting and receiving antennas 27, 28 share the directional coupler 26, these antennas radiate waves again and again. Thus, a portion of the received reflected wave is delayed from the reflected wave which is required by the single-diode mixer 29, and applied as an unnecessary wave to the single-diode mixer 29. However, inasmuch as this unnecessary wave is produced by an FM signal that has reciprocated twice or more between the antenna and the reflecting object, it is of a level sufficiently lower than the level of the reflected wave that is required by the single-diode mixer 29 because of a relatively low gain of the transmitting and receiving antennas 26, 27 and a large space propagation loss, and hence any effect of the unnecessary wave on the radar functions can be ignored.

As described above, the high-frequency signal generator used in the radar module does not require the conventional process of cutting off a dielectric substrate (printed-circuit board, etc.) with a knife and bonding a bias supply line with silver paste. The high-frequency signal generator can thus be assembled with a greatly reduced amount of labor, and can be manufactured with good reproducibility.

While the invention has been described with respect to the radar module which incorporates the FM signal generator, the process of forming the metal pattern on the printed-circuit board for adjusting the oscillation frequency of the gunn diode through dimensional adjustment is not limited to the FM signal generator but applicable to various high-frequency signal generators.

The high-frequency signal generator used in the radar module according to the above embodiment can easily be arranged for use as an FM signal generator, and can easily and reliably control the frequency of an FM signal when it is arranged as an FM signal generator in the millimeter wave band for use in an FM radar module in the form of a non-radiative dielectric waveguide. The high-frequency signal generator is also simple in structure and small in size.

As the metal pattern is formed on the printed-circuit board for adjusting the oscillation frequency of the gunn diode through dimensional adjustment, the oscillation frequency of a high-frequency signal generator such as an FM signal generator can easily be adjusted or varied simply by replacing the printed-circuit board.

The gunn diode member or gunn diode GD is separate from the diode mount DM as shown in FIG. 5. However, the gunn diode GD and the diode mount DM may be integral with each other as described below.

Figure 7:
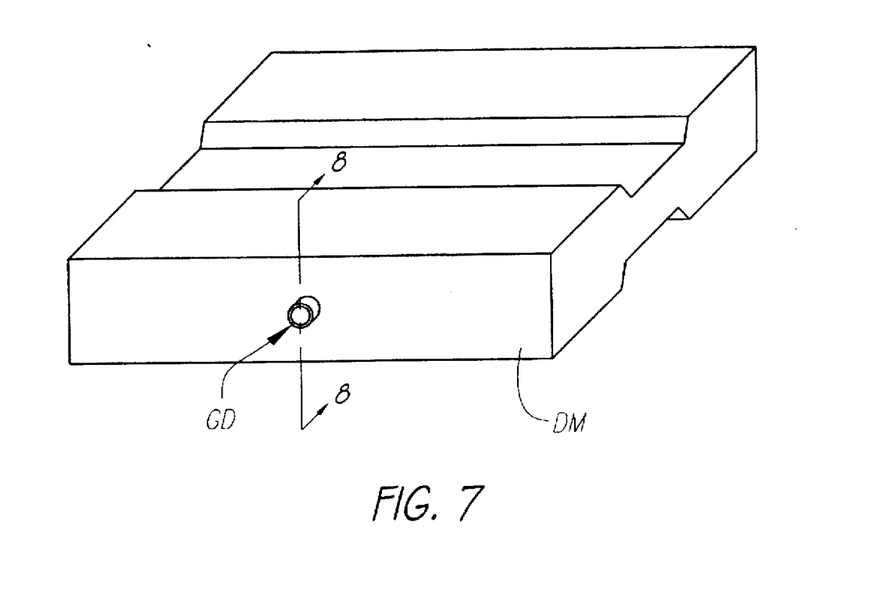
FIG. 7 is a perspective view of an integral assembly of a diode mount and a gunn diode.
Figure 8:
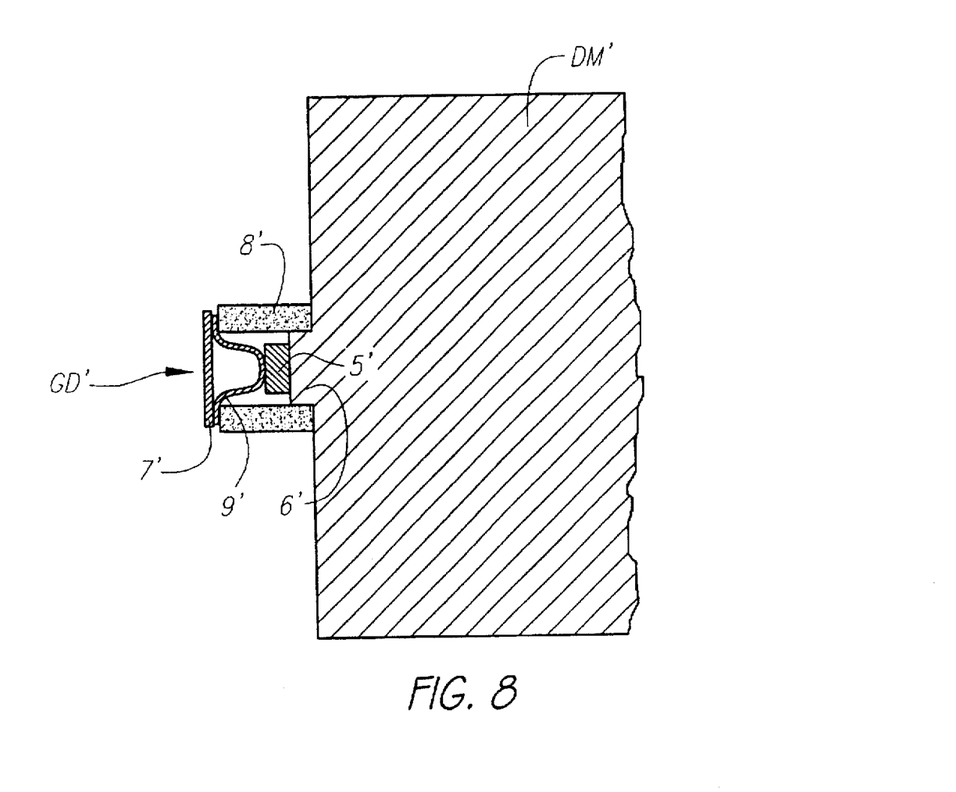
FIG. 8 is a cross-sectional view taken along line VIII—VIII of FIG. 7.
Figure 9:
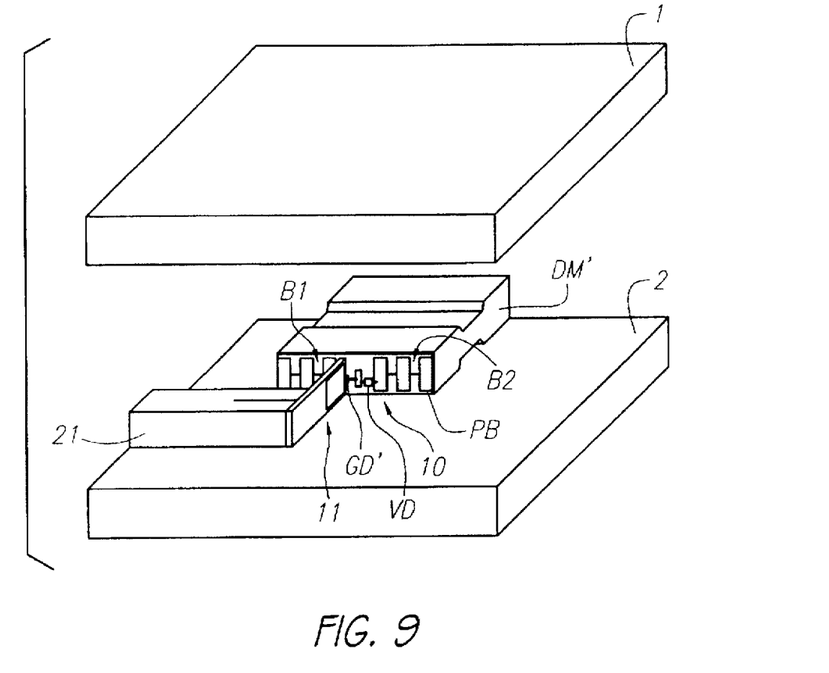
FIG. 9 is a perspective view, partly broken away, of a high-frequency signal generator and its associated components in a radar module which employs the integral assembly shown in FIG. 7.

FIGS. 7 and 8 show a modification in which a gunn diode member or gunn diode GD' and a diode mount DM' are integral with each other. The diode mount DM' has a disk-shaped pad 6' positioned substantially centrally on a side thereof to perform substantially the same function as the lower conductor 6 in the above embodiment. A gunn diode element or a gunn diode pellet (or chip) 5' is fixedly mounted on the disk-shaped pad 6' by thermal compression or soldering in an upside-down configuration with a heat-generating active layer facing downwardly. Therefore, one terminal on the active layer of the gunn diode element or gunn diode pellet 5' is supplied with a ground potential from the diode mount DM' that is kept at the ground potential. The gunn diode element 5' is surrounded by a cylindrical ceramics member 8' for performing the same function as the package 8 in the above embodiment. The cylindrical ceramics member 8' is mounted on the diode mount DM' through a metallized layer. A metal lid plate 7' which performs the same function as the upper conductor 7 in the above embodiment is attached to the distal end of the cylindrical ceramics member 8' through a gold ribbon 9' that is connected to the other terminal of the gunn diode element 5'. The gunn diode GD' integral with the diode mount DM' may be held between the upper and lower parallel conductive plates 1, 2, thus providing a high-frequency signal generator or FM signal generator 10 as shown in FIG. 9.

As shown in FIG. 7, each of the upper and lower surfaces of the diode mount DM' has a groove defined therein which has a depth equal to ¼ of the wavelength of the oscillated signal for preventing the oscillated signal from leaking out.

As with the above embodiment, the high-frequency signal generator with the modified gunn diode integral with the diode mount can easily be arranged for use as an FM signal generator in the millimeter wave band for use in an FM radar module in the form of a non-radiative dielectric waveguide. The high-frequency signal generator is also simple in structure and small in size.

Since the gunn diode and the diode mount are integral with each other, any complex machining process, which would otherwise be needed to reduce the thickness of a diode mount for using FM signals of relatively high frequencies, is no longer necessary, and hence the integral assembly can be manufactured less costly.

The high-frequency signal generator and the radar module have been described as employing the non-radiative dielectric waveguide, the propagation line is not limited to the non-radiative dielectric waveguide, but may be a dielectric waveguide such as an H guide or an insular waveguide.

The high-frequency signal generating element or oscillating element is not limited to the gunn diode, but may be any of various other solid-state oscillating elements including an IMPATT diode, a TUNNET diode, a BARIT diode, a TRAPATT diode, an LSA diode, etc.

Although there have been described what are at present considered to be the preferred embodiments of the invention, it will be understood that the invention may be embodied in other specific forms without departing from the essential characteristics thereof. The present embodiments are therefore to be considered in all respects as illustrative, and not restrictive. The scope of the invention is indicated by the appended claims rather than by the foregoing description.

What is claimed is:

1. A high-frequency signal generator comprising:

a conductive plate;

at least one dielectric rod mounted on said conductive plate;

a mount;

oscillating means for generating a high-frequency signal mounted on a side of said mount;

a printed-circuit board mounted on said side of said mount and including bias supply means disposed on a surface thereof for supplying a bias voltage to said oscillating means; and a metal pattern disposed on said surface of said printed-circuit board and dimensionally adjustable for adjusting the oscillation frequency of said oscillating means.

2. A high-frequency signal generator comprising:

at least one conductive plate;

a dielectric rod mounted on said conductive plate;

a mount;

oscillating means for generating a high-frequency signal mounted on a side of said mount; and a printed-circuit board mounted on said side of said mount and including bias supply means disposed on a surface thereof for supplying a bias voltage to said oscillating means.

* * * * *

UNITED STATES PATENT AND TRADEMARK OFFICE
CERTIFICATE OF CORRECTION

PATENT NO. : 5,717,400
DATED : February 10, 1998
INVENTOR(S) : Uematsu et al.

It is certified that error appears in the above-identified patent and that said Letters Patent is hereby corrected as shown below:

In column 1, line 36, please change "wadeguide" to -- waveguide --

In column 5, line 20, please change "M" to -- H --

Signed and Sealed this

Fifteenth Day of June, 1999

Attest:

Q. TODD DICKINSON

*Attesting Officer*  *Acting Commissioner of Patents and Trademarks*